United States Patent
Debray et al.

(10) Patent No.: US 7,294,868 B2
(45) Date of Patent: Nov. 13, 2007

(54) SUPER LATTICE TUNNEL JUNCTIONS

(75) Inventors: Jean-Philippe Michel Debray, Plano, TX (US); James K. Guenter, Garland, TX (US)

(73) Assignee: Finisar Corporation, Sunnyvale, CA (US)

( * ) Notice: Subject to any disclaimer, the term of this patent is extended or adjusted under 35 U.S.C. 154(b) by 26 days.

(21) Appl. No.: 11/191,787

(22) Filed: Jul. 28, 2005

(65) Prior Publication Data
US 2006/0011938 A1 Jan. 19, 2006

Related U.S. Application Data

(63) Continuation-in-part of application No. 10/877,915, filed on Jun. 25, 2004, now Pat. No. 7,184,454.

(51) Int. Cl.
*H01L 29/00* (2006.01)
(52) U.S. Cl. ....................................... 257/104
(58) Field of Classification Search ................. 257/104
See application file for complete search history.

(56) References Cited

U.S. PATENT DOCUMENTS 7,016,392 B2 * 3/2006 Tandon et al. ................ 372/96
7,136,406 B2 * 11/2006 Ryou ..................... 372/45.011

* cited by examiner

*Primary Examiner*—Roy Potter
(74) *Attorney, Agent, or Firm*—Workman Nydegger

(57) ABSTRACT

Super lattice structures in conjunction with a tunnel junction to provide an improved contact for multiple components. The tunnel junctions can include a first semiconductor material having a resistance parameter for conducting a current and a second semiconductor material having a resistance parameter that is more restrictive to conduction of a current than the resistance parameter of the first semiconductor material. The first semiconductor material can have a critical thickness at which lattice matching of the first semiconductor material causes dislocation. The second semiconductor material can have a critical thickness at which lattice matching of the second semiconductor material causes dislocation that is thicker than the critical thickness of the first semiconductor material. The tunnel junction can be used in a monolithically manufactured photo transmitter and receiver design.

25 Claims, 10 Drawing Sheets

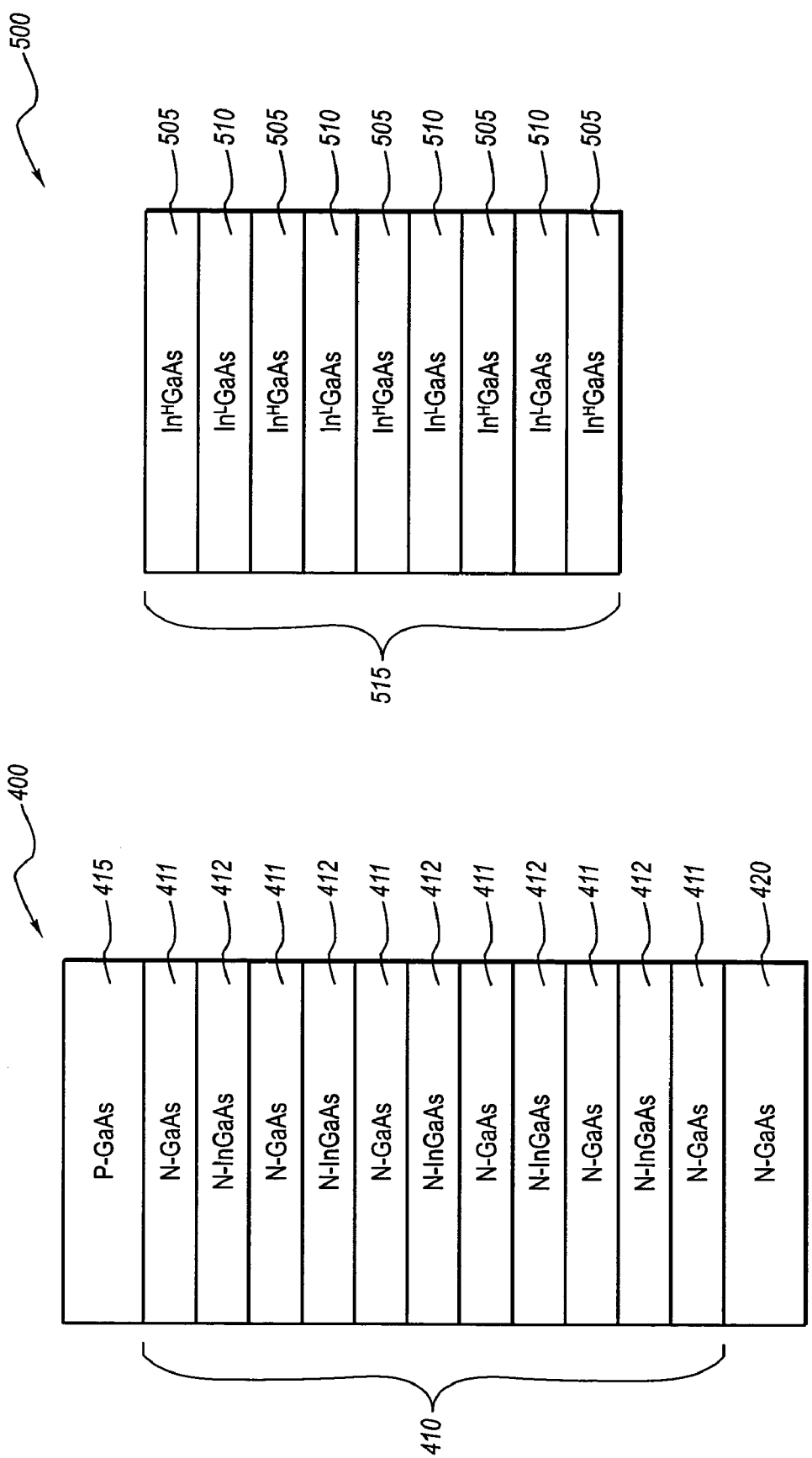

SUPER LATTICE TUNNEL JUNCTIONS

CROSS-REFERENCE TO RELATED APPLICATIONS

This application is a continuation in part of U.S. patent application Ser. No. 10/877,915 entitled "Light Emitting Device With an Integrated Monitor Photodiode" filed Jun. 25, 2004 now U.S. Pat. No. 7,184,454, the contents of which is hereby expressly incorporated by reference herein.

BACKGROUND OF THE INVENTION

1. The Field of the Invention

The invention generally relates to tunnel junctions. More specifically, the invention relates to using a super lattice structure in conjunction with a tunnel junction to provide an improved contact for multiple components.

2. Description of the Related Art

Tunnel junctions are used in various applications to provide a common connection between two components. One application of tunnel junctions is in the design of components made at least in part from III-V (three-five) semiconductor materials. In such applications it can be advantageous to have a low resistance tunnel junction. Often, in order to obtain a low resistance, the tunnel junction must be heavily doped to reduce the bandgap. In some instances a tunnel junction made from a combination of III-V semiconductor materials would have the desired resistance properties, but it has not been possible to use this combination of III-V semiconductor materials for various reasons. One reason why a combination of III-V semiconductor material cannot be used is because the III-V semiconductor materials have a mismatched lattice parameter resulting in a critical thickness that is too thin to be used without the tunnel junction experiencing a dislocation and subsequent cracking.

There are several III-V semiconductor materials that would otherwise be used to create tunnel junctions with desirable low resistance properties if not for their undesirable lattice parameters. One example of a III-V semiconductor with such properties is Indium (In). In can be combined with other III-V semiconductor materials, such as Gallium (Ga) and Arsenide (As). Two constraints, however, that limit the relative proportion of In to Ga and As are the necessary thickness of a tunnel junction and the critical thickness of the material due to lattice mismatched parameters. The critical thickness of the material, however, is a function of the proportion of the In relative to the GaAs in the material. As illustrated in FIG. 1, and is known to one of ordinary skill in the art, as the relative proportion of the In increases, the critical thickness of the InGaAs material becomes thinner. Similarly, as the relative proportion of In increases, the resistance of the resulting tunnel junction decreases. In other words, a relatively high proportion of In is desirable to reduce the resistance of the tunnel junction, but the thickness of a tunnel junction is limited because of the critical thickness of InGaAs due to the mismatched lattice parameter of the materials that can result in dislocation. For example, it may be advantageous to use about 15% In, which can result in a critical thickness of InGaAs at about 150 angstroms. This is typically too thin for a tunnel junction in applications where the tunnel junction should be equal to or greater than 150 angstroms, for example where a tunnel junction with a thickness of about 500 angstroms is.

Components made from III-V semiconductor materials include optoelectronic devices, such as lasers, light emitting diodes (LEDs), and photodiodes. Lasers have become useful devices with applications ranging from simple laser pointers that output a laser beam for directing attention, to high-speed modulated lasers useful for transmitting high-speed digital data over long distances of optical fiber. Several different types of lasers exist and find usefulness in applications at the present time. One type of laser is the edge emitting laser, which can be formed at least in part by cleaving a diode from a semiconductor wafer. Cleaving a diode from a semiconductor wafer forms facets creating reflective surfaces that form a laser cavity defined by the edges of the laser diode. Reflective and antireflective coatings can be applied to the facets of edge emitter lasers, and edge emitting lasers can be designed to emit a laser beam more strongly from one of the edges than the other edges. However, some laser energy is typically emitted at the other edges.

A second type of laser is known as a vertical cavity surface emitting laser (VCSEL). A VCSEL can include semiconductor active regions, distributed Bragg reflector (DBR) mirrors, current confinement structures, substrates, and contacts. A VCSEL can be formed in part by forming a first mirror from DBR semiconductor layers. The DBR layers can alternate high and low refractive indices so as to create the mirror effect. An active layer can then be formed on the first mirror. A second mirror can be formed on the active layer using more DBR semiconductor layers. Thus the VCSEL laser cavity can be defined by top and bottom mirrors that cause a laser beam to be emitted from the surface of the laser. Laser diodes typically operate using a forward bias. To forward bias a laser diode, a voltage can be applied to the anode and a lower voltage or ground can be connected to the cathode.

In some simple applications, lasers may be operated open loop (i.e., the lasers do not require feedback, or can operate satisfactorily without feedback). In other applications, it may be very important to precisely gauge the amount of actual output power emitted by the laser while it is operating. For example, in communications applications it may be useful to know the actual output power of the laser such that the output power of a laser may be adjusted to comply with various standards or other requirements.

Many applications use a laser and a photodiode or other photosensitive device to control the output of the laser. An appropriately placed photodiode can be used as one element in the feedback circuit for controlling the laser. Various challenges exist, however, when implementing a laser diode and photodiode together. While the laser diode and photodiode share a similar construction and composition, they have generally been implemented as separate devices. This allows a single power supply to be used for both biasing the laser diode and photodiode which are biased using opposite polarities. Using two discrete components, however, results in an increase of cost.

Attempts have been made to integrate the laser diode and photodiode monolithically on a single wafer substrate. However, as alluded to above, this may require the use of two power supplies such as in the case when the laser diode and photodiode share a common cathode or anode. Additionally, the photodiode may be placed on top of the VCSEL or within a mirror that is part of the VCSEL. This however has the unfortunate drawback of causing the photodiode to become a part of the optics, particularly the mirror, of the laser thus altering the optical characteristics of the laser. Therefore, what would be advantageous are improved methods and apparatuses for providing a common connection to multiple component using a tunnel junction.

BRIEF SUMMARY OF THE INVENTION

The present invention relates to using a super lattice structure in conjunction with a tunnel junction to provide an improved contact for multiple components. A tunnel junction for providing a common connection to two components is described. The tunnel junction can include a first semiconductor material having a resistance parameter for conducting a current and a second semiconductor material having a resistance parameter that is more restrictive to conduction of a current than the resistance parameter of the first semiconductor material. The first semiconductor material can have a critical thickness at which lattice matching of the first semiconductor material causes dislocation. The second semiconductor material can have a critical thickness at which lattice matching of the second semiconductor material causes dislocation, wherein the critical thickness of the second semiconductor is thicker than the critical thickness of the first semiconductor material.

An optoelectronic device is described. The optoelectronic device can include a vertical cavity surface emitting laser (VCSEL) diode, a tunnel junction and a photodiode. The VCSEL can include a first PN junction with a first p layer and a first n layer. The tunnel junction can be coupled monolithically to the VCSEL diode. The tunnel junction can include a heavily doped n+ layer and a heavily doped p+ layer, a first material layer comprising a first III-V semiconductor material layer having a first resistance parameter and a first critical thickness parameter, and a second material layer comprising a second III-V semiconductor material layer having a second resistance parameter that is less resistive than the first resistance parameter and a second critical thickness parameter that is thinner than the first critical thickness parameter. The photodiode can be coupled monolithically to the tunnel junction.

A method of manufacturing a tunnel junction is described. The method can include forming a layer of a first material having a first resistive parameter and a first critical thickness parameter, and forming a layer of a second material having a second resistive parameter and a second critical thickness parameter, wherein the second resistive parameter is more resistive to the flow of current than the first resistive parameter and the second critical thickness is thicker than the first critical thickness.

These and other aspects of the present invention will become more fully apparent from the following description and appended claims, or may be learned by the practice of the invention as set forth hereinafter.

BRIEF DESCRIPTION OF THE DRAWINGS

To further clarify the above and other aspects of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 4 is a diagram illustrating alternating layers of at least a portion of an example super lattice tunnel junction according to an example embodiment of the present invention.

FIG. 5 is a diagram illustrating alternating layers of at least a portion of a super lattice tunnel junction according to an example embodiment of the present invention.

FIG. 10 illustrates optimizations for self mixing applications to increase the sensitivity of an optoelectronic device to light reflections, temperature changes and the like.

DETAILED DESCRIPTION OF THE PREFERRED EMBODIMENTS

The present invention is related to improved tunnel junctions. The principles of the present invention are described with reference to the attached drawings to illustrate the structure and operation of example embodiments used to implement the present invention. Using the diagrams and description in this manner to present the invention should not be construed as limiting its scope. Additional features and advantages of the invention will in part be obvious from the description, including the claims, or may be learned by the practice of the invention. Descriptions of well-known components and processing techniques are omitted so as not to unnecessarily obscure the invention in detail.

Embodiments of the present invention include devices incorporating super lattice tunnel junctions. For example, several example embodiments of the present invention include monolithically formed laser diodes and photodiodes where a common contact is provided by an improved tunnel junction. According to these example embodiments, the laser diodes and photodiodes can be connected through the super lattice tunnel junctions such that a single power supply can also be used to power both the laser diodes and photodiodes. Appropriate contacts can be formed to allow access to the various junctions of the laser diodes, tunnel junction, and photodiodes.

Figure 2:
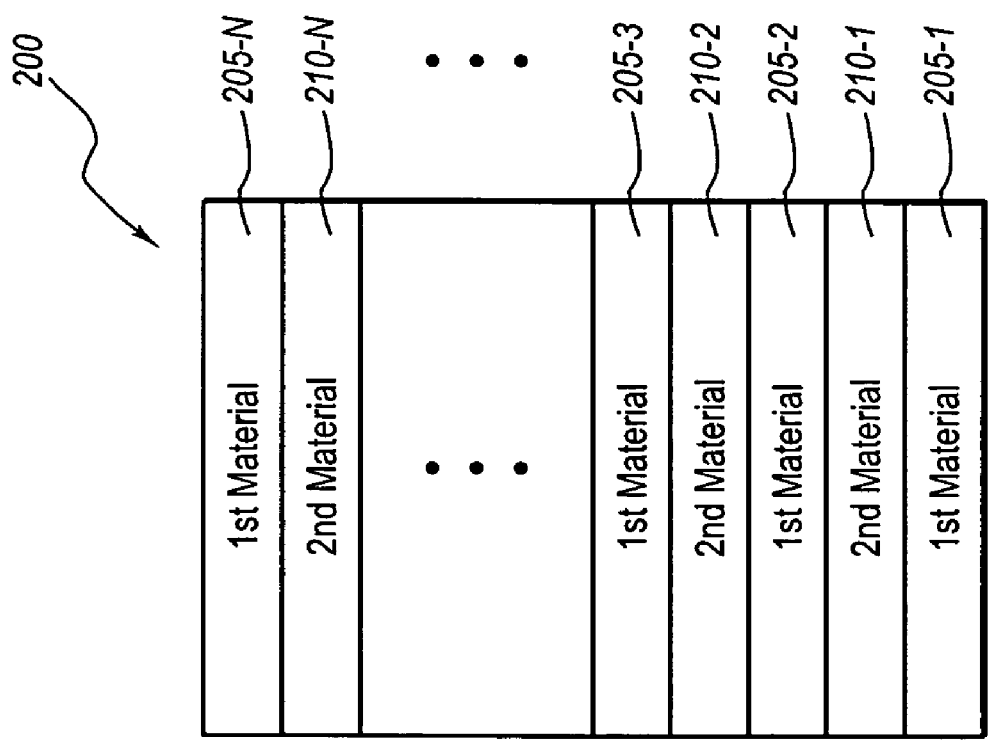
FIG. 2 is a diagram illustrating super lattice layers of at least a portion of a tunnel junction according to example embodiments of the present invention.

Referring to FIG. 2, a diagram is shown illustrating super lattice layers of at least a portion of a tunnel junction 200 according to example embodiments of the present invention. The super lattice tunnel junction 200 can comprise alternating layers of two different III-V semiconductor materials having different compositions and parameters. For example, a first layer 205-1 can be formed from a first material 205, for example using a method of epitaxial growth. The first material 205 can comprise a first III-V semiconductor material that has a first composition and first set of parameters. The first material 205 can have a parameter that allows for reduced resistance, but also have a parameter that restricts the thickness that the first material 205 can be grown without dislocation. One parameter that can restrict the thickness is critical thickness for dislocation. Dislocation can be a result of stresses caused by mismatched lattice parameters of several components of the first material 205.

A second layer 210-1 can be formed upon the first layer 205-1, for example using methods of epitaxial growth. The second layer 210-1 can be formed from a second material 210 having a different composition and set of parameters. For example, the second material 210 can include a parameter that has relatively increased resistance than the first material 205, but has a relatively thicker critical thickness parameter than the first material 205. Thus, the second layer 210-1 of the second material 210 can have a lower level of mismatched lattice parameters of several components of the second material 210. Several additional alternating layers 205-2 through 210-N of the first material 205 and the second material 210 can be produced, for example using methods of epitaxial growth, until the super lattice tunnel junction 200 is constructed having an appropriate thickness with more desirable parameters that is otherwise obtained with a single material. Many different III-V semiconductor materials can be used in different combinations to select and create different alternating layers of a super lattice tunnel junction according to embodiments of the present invention. Moreover, any number of alternating layers of different III-V semiconductor materials can be formed. For example more than two different alternating III-V semiconductor materials can be formed in a similar fashion to that described herein.

Figure 1:
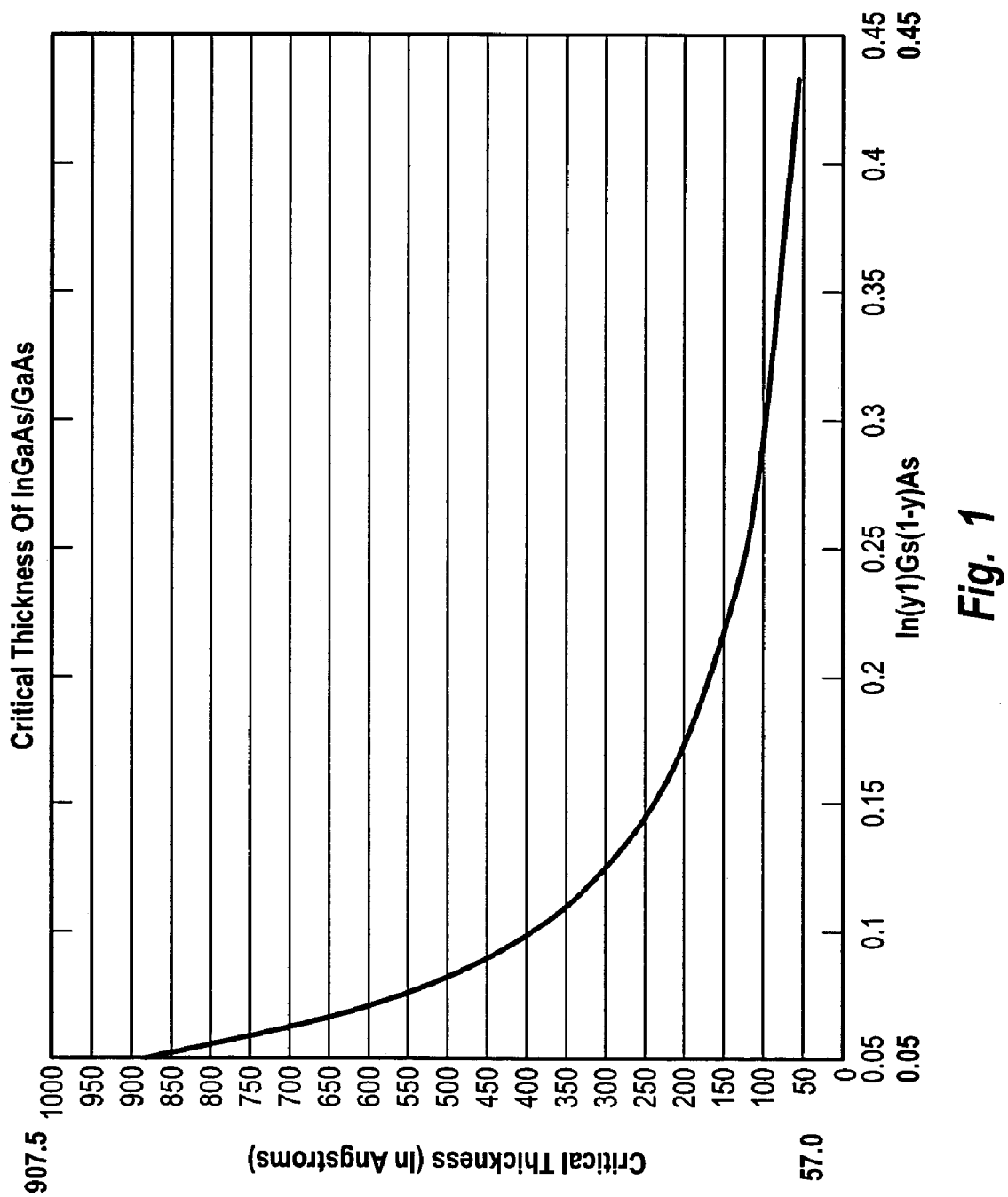
FIG. 1 is a plot of relative proportion of the In versus the critical thickness of an InGaAs material.
Figure 3:
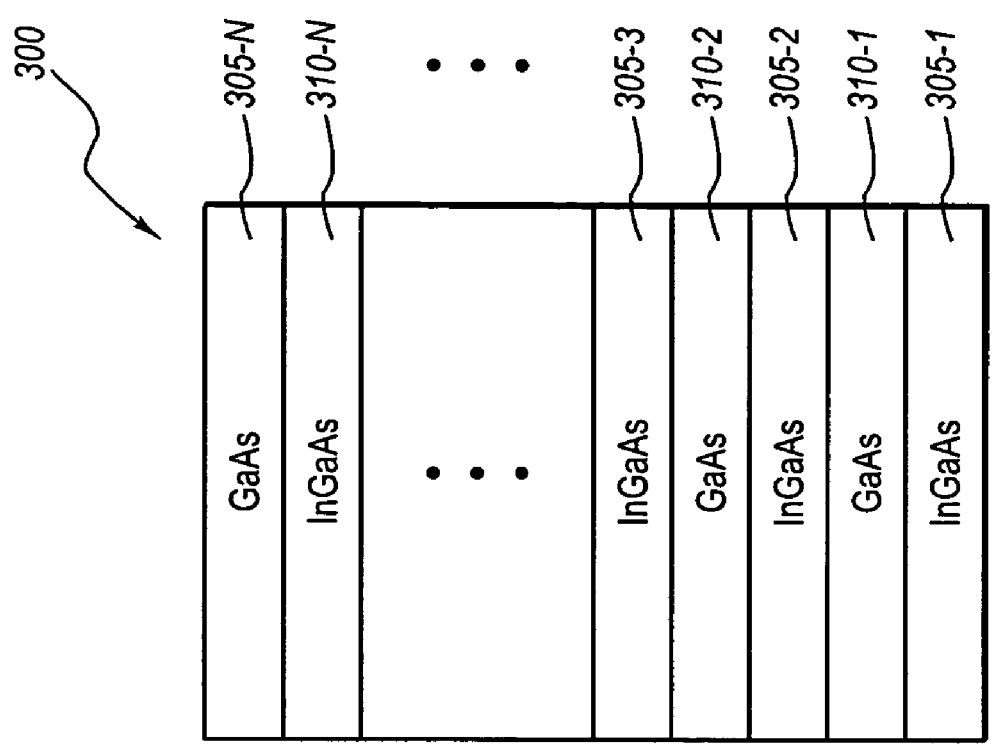
FIG. 3 is a diagram illustrating super lattice layers of at least a portion of a tunnel junction according to example embodiments of the present invention.

Referring to FIG. 3, a diagram is shown illustrating super lattice layers of at least a portion of a tunnel junction 300 according to example embodiments of the present invention. The super lattice tunnel junction 300 can comprise alternating layers 305-1 through 310-N of two III-V semiconductor materials 305 and 310 having different compositions and parameters. A first layer 305-1 of a first material 305 can be produced, for example using a method of epitaxial growth. For example, the first material 305 can comprise Indium Gallium Arsenide (InGaAs) that has a first set of parameters. The first material 305 can include a parameter that allows for reduced resistance for conduction of a current, but also has a parameter that restricts the critical thickness that the first material 305 can be grown. The critical thickness for dislocation of the first material can be caused by mismatched lattice parameters of the In as compared with other GaAs material lattice parameters.

A second material 310 can comprise Gallium Arsenide (GaAs) and a first layer 310-1 can be formed upon the first layer 305-1 of InGaAs, for example using methods of epitaxial growth. The second material 310 comprising GaAs can have different parameters than the first material 305 comprising InGaAs. For example, the second material 310 can have relatively increased resistance as compared to the first material 305, but can have a relatively lower level of mismatched lattice parameters, and as a result, a thicker critical thickness parameter than the first material 305. Several a additional alternating layers of InGaAs 305-2 through 305-N and InGa 310-1 through 310-N can be produced using methods of epitaxial growth, until the super lattice tunnel junction is constructed having an appropriate thickness with the desired overall parameters. Many different III-V semiconductor materials can be used in addition to GaAs and InGaAs, and different combinations to select and create different alternating layers of a super lattice tunnel junction according to embodiments of the present invention can be included. Moreover, any number of alternating layers of different III-V semiconductor materials, for example GaAs, InGaAs, InGaAlAs, InP, InGaAsP, InGaAlSb, having different bandgap (i.e. resistive properties) can be used.

Relative thickness and/or other parameters of the layers of the alternating layers can be varied. For example, the doping level of each layer can also be varied. Referring to FIG. 4, a diagram is shown illustrating alternating layers of at least a portion of an example super lattice tunnel junction 400 according to an example embodiment of the present invention. As shown, a super lattice 410 can include alternating negatively doped layers of GaAs 411 and InGaAs 412 of a relatively thinner thickness than a positively doped GaAs layer 415 and a relatively thicker negatively doped GaAs layer 420. For example, the thickness of the outer layers 415 and 420 can be at least between about 2 and 15 times thicker than the thinner alternating layers 410. According to these examples, the alternating layers of GaAs 411 can be between about 2 nm and 10 nm in thickness, while the alternating layers of InGaAs 412 can be between about 1 nm and about 5 nm. The thickness of the thicker outer layers of GaAs 415 and 420 can be about 30 nm according to this example embodiment of the present invention.

The doping levels of the different layers of the super lattice tunnel junction can also be varied. For example the thicker outer layer of positively doped GaAs 415 can be positively doped between about $8\text{-}50 \times 10^{18}$, the thicker outer layer of negatively doped GaAs 420 can be negatively doped at about $2 \times 10^{18}$, the alternating thinner layers of GaAs 411 can be negatively doped at about $4 \times 10^{18}$ and the alternating layers of InGaAs 412 can be negatively doped at about $6 \times 10^{18}$. The alternating layers 410 of GaAs 411 and InGaAs 412 can also be of relatively different thickness according to other embodiments of the present invention. As a result of this configuration, the super lattice tunnel junction 400 can have an improved overall resistance parameter with lower resistance over the GaAs 411 layers alone and an improved critical thickness than the InGaAs 412 layers alone.

According to other example embodiments, the alternating layers of a super lattice tunnel junction can include the same components, but different relative proportions of the components to create alternating layers with different parameters. Thus, the relative proportions of the components of the III-V semiconductor materials can be varied from one layer to another. For example a first layer of a set of alternating layers can include a certain relative percentage of components to achieve certain parameters, while another alternating layer can include at least some of the same components, but with a different relative percentage of the components.

For example, referring to FIG. 5, a diagram is shown illustrating alternating layers of at least a portion of an example super lattice tunnel junction 500 according to an example embodiment of the present invention. As shown, the super lattice tunnel junction 500 can include several alternating layers of InGaAs material 515 comprising the same type of components (i.e. InGaAs). However, the relative proportions of the components in the lasers 515 are not the same resulting in alternating layers with different parameters. For example, the alternating layers 515 can have layers 505 with a relatively higher percentage of Indium than other layers 510. The layers 505 with higher percentage of Indium can have parameters that allow for reduced resistance, but exhibit a higher tendency for dislocation and a thinner critical thickness. The layers 510 with a lower percentage of indium can have parameters that have increased resistance, but exhibit a lower tendency for dislocation and a thicker critical thickness. As a result of this configuration, the super lattice tunnel junction 500 can have an improved overall resistance parameter with lower resistance than a tunnel junction made solely from the same material as the layers 510 with low levels of indium and a thicker critical thickness than a tunnel junction made solely from the same material as the layers 505 with high levels of indium.

Figure 6:
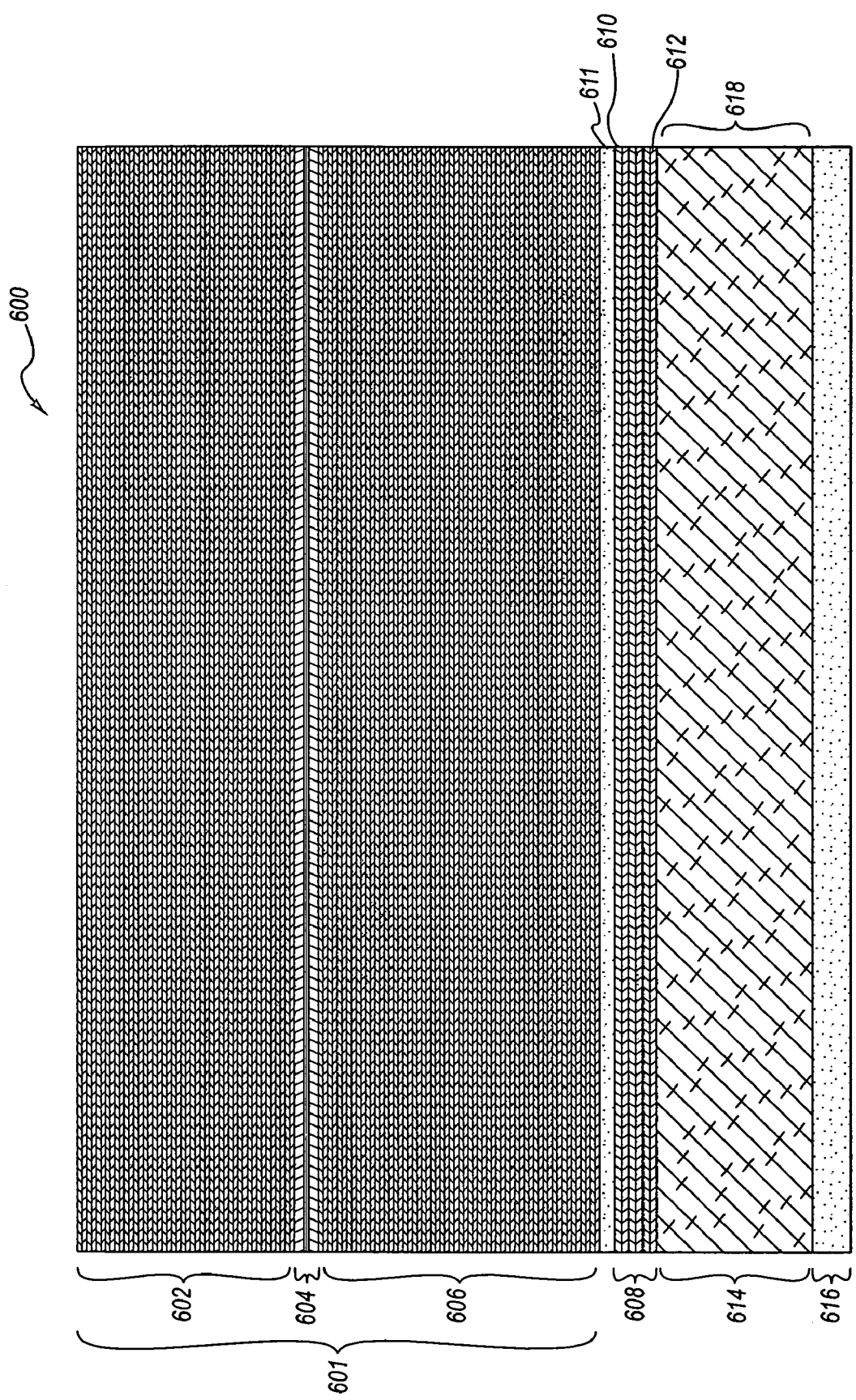
FIG. 6 is an example of an optoelectronic device including an epitaxial structure 600 that includes layers formed on a wafer substrate.

Referring now to FIG. 6, an example of an optoelectronic device including an epitaxial structure 600 that includes layers formed on a wafer substrate is shown. In one embodiment, the structure 600 can be grown using a GaAs wafer. However, other III-V (three-five) semiconductor combinations may also be used. FIG. 6 shows a vertical cavity surface emitting laser (VCSEL) 601. The VCSEL 601 in the example shown includes a top mirror 602, an active region 604, and a bottom mirror 606. A P-N junction exists in the active region 604.

A spacer layer 611 can be formed below the bottom mirror 606. The spacer layer 611 is preferably about 5λ/4 or 7λ/4 where λ is the wavelength of light that the VCSEL 601 is designed to emit. The spacer layer 611 can be any odd integral multiple of the wavelength (i.e., $$\frac{\lambda(1+n)}{4}$$

where n is an integer) that is thick enough to account for non-uniformities that may occur in various layers of the epitaxial structure 600. The spacer layer 611 can be sufficiently thick such that when etching is done to the spacer layer 611 the deepest non-uniformities do not go all the way through the spacer layer 611 and the shallowest potions reach the spacer layer 611. A goal, therefore, is to expose the spacer layer 611 without going all the way through the spacer layer 611 at any point. Subsequent processing can use a selective etchant, such as dilute hydrofluoric acid, to uniformly expose the layer underlying the spacer.

The epitaxial structure 600 can further include a super lattice tunnel junction 608, such as those described herein, formed on and electrically connected to the VCSEL 601. The super lattice tunnel junction 608 can include a heavily doped n+ layer 610 and a heavily doped p+ layer 612. The super lattice tunnel junction 608 can include a super lattice structure. The super lattice structure can include alternating layers of III-V semiconductor materials with different conductive properties. For example the super lattice tunnel junction 608 can include several layers of a first III-V semiconductor material having a first conductive property. The super lattice tunnel junction 608 can also include several layers of a second III-V semiconductor material having a second conductive property. The super lattice tunnel junction 608 can include several alternating layers of the first and second III-V semiconductor materials. In this manner, the super lattice tunnel junction 608 can include desirable parameters exhibited in one of the III-V semiconductor materials at a tunnel junction 608 thickness that would otherwise not be possible because of a parameter of one of the III-V semiconductor materials of the super lattice tunnel junction 608.

The super lattice tunnel junction 608 can further include the doped n+ layer 610 and the doped p+ layer 612 surrounding the super lattice structure. It may also be desirable that the super lattice tunnel junction 608 be at least partially transparent so as to allow optical energy to pass through to the photodiode layer 614. This may be done by increasing doping on the doped n+ layer 610 so as to increase transparency through the so-called Burstein shift. It can be advantageous to balance the thickness of the doped p+ layer 612 such that appropriate conduction exists through the super lattice tunnel junction 608 while maintaining appropriate transparency. Any of the layers can be nearly any practicable thickness without imposing an optical penalty.

The epitaxial structure 600 can further include a photodiode, formed on and electrically connected to the super lattice tunnel junction 608 that can include a second P—N junction that is comprised of the doped p+ layer 612 of the super lattice tunnel junction 608 and a lightly doped photodiode n layer 614. An additional p layer (not shown) that is not as heavily doped can also be fabricated between the p+ layer 612 and the photodiode n layer 614. In one embodiment, the epitaxial structure 600 can be constructed on an n type substrate 616. Although the substrate 616 is illustrated in FIG. 6 as a thin layer, the substrate can be in the hundreds of microns whereas the epitaxial, structure including the photodiode, the super lattice tunnel junction 608, and the laser diode 601 can be about 10 microns. The epitaxial structure 600 can be grown using a metal organic chemical vapor phase deposition (MOCVD) process.

The top mirror 602 can be a distributed Bragg reflector (DBR) that generally comprises a number of alternating layers with high and low indexes of refraction. This creates a mirror with high reflectivity, around 99.5%. In the example shown, the top mirror is constructed of p type materials such as carbon doped aluminum gallium arsenide (AlGaAs), where the fraction of Al can vary from 0% to 100%. The top mirror 602 include about 20 mirror periods, for example, where each period can include a high index of refraction layer and a low index of refraction layer.

The active region 604 can include a number of quantum wells for stimulating the emission of laser energy. In the embodiment shown, active region 604 can be less than 1 micron.

A bottom mirror 606 can be located below the active region 604. The bottom mirror 606 can be comprised of about 30 to 35 doped n type mirror periods, for example. Silicon is one example of a dopant that may be used in the bottom mirrors.

Below the super lattice tunnel junction 608 is the photodiode 618. The photodiode 618 should be constructed so as to have an appropriate responsivity to incoming light. Thus, in example embodiments of the invention, the photodiode 618 includes a lightly doped n layer 614 that can be approximately three microns or less when the VCSEL 601 is designed to emit an 850 nm wavelength. Embodiments of the invention can include a lightly doped n layer 614 that can be about 1.5 microns. Notably, the thickness of the lightly doped n layer 614 can be used to tailor the responsivity and speed of the photodiode.

Figure 7A:
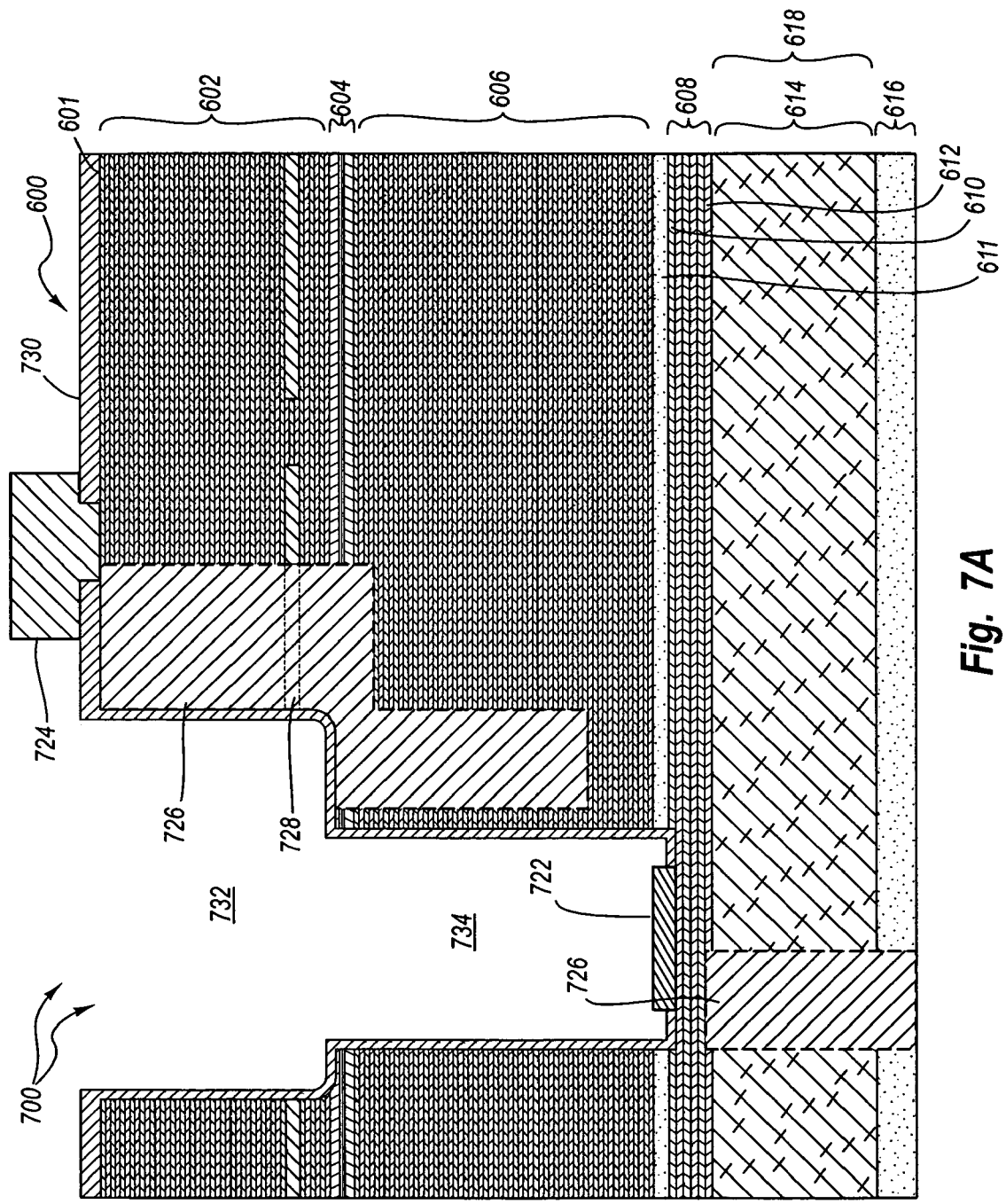
FIG. 7A illustrates an embodiment where contacts and oxide layers are formed through a photolithographic process.

Referring now FIG. 7A, an embodiment is shown where contacts and oxide layers are formed through a photolithographic process. The formation of contacts allows appropriate biasing to be applied to, and signals to be read from the VCSEL 601 and photodiode 618. The lithographic process can include a series of acts where photoresist is applied to the epitaxial layers 600. The photoresist is then exposed lithographically to various patterns. Lithographic exposure allows a pattern of photoresist to remain on the epitaxial layers 600 while the remainder of the photoresist may be washed from the epitaxial layers 600.

The patterns of photoresist that remain on the epitaxial layers 600 block ions from being implanted in the epitaxial layers 600, metal from being deposited on the epitaxial layers 600, and etching solutions from etching portions of the epitaxial layers 600. Thus, using appropriate photolithographic processes a monolithic structure 700 that includes a VCSEL 601, a super lattice tunnel junction 608 and a photodiode 618 can be constructed with appropriate contacts and with appropriate isolation from other devices on a wafer being fabricated simultaneously.

In the example embodiment shown in FIG. 7A, a tunnel junction contact 722 can be formed such that it connects to the doped p layer 612. A VCSEL contact 724 can be formed such that it connects to the top mirror 602 of the VCSEL 601. Another contact can be formed on the bottom of the substrate 616 to provide the appropriate contact to the photodiode 618. Isolation barriers 726 can be formed to isolate the VCSEL 601 and the photodiode 618 from other devices being formed on the substrate 616. An aperture 728 can be oxidized into the top mirror 602. The aperture 728 is used primarily to direct current flow through the VCSEL 601.

More specifically, the optoelectronic device 700 can be fabricated from an epitaxial structure 600. The epitaxial structure 600 can have a dielectric such as silicon dioxide or silicon nitride grown on it to form a portion of the dielectric layer 730. A shallow trench mask can be used to remove portions of the oxide using an etching process. An etch process can be used to form the shallow trench 732 in the VCSEL 601. The aperture 728 can then be oxidized into the VCSEL 601.

A deep trench mask can then be used to etch the deep trench 734. An etch can be used to etch down to a thick AlAs spacer 611. This spacer may be AlAs or another AlGaAs composition, so long as the fraction of aluminum is substantially greater than that in the underlying layer. A stop etch may be used to etch through the AlAs spacer 611 to the n+ layer 610. Another etch can be used to etch through the n+ layer 610 to the p+ layer 612. At this point, an additional oxide may be grown that forms additional portions of the dielectric layer 730. Portions of the dielectric layer 730 can be removed followed by deposition of metal to form contacts 722, 724 on the optoelectronic device 700.

Figure 7B:
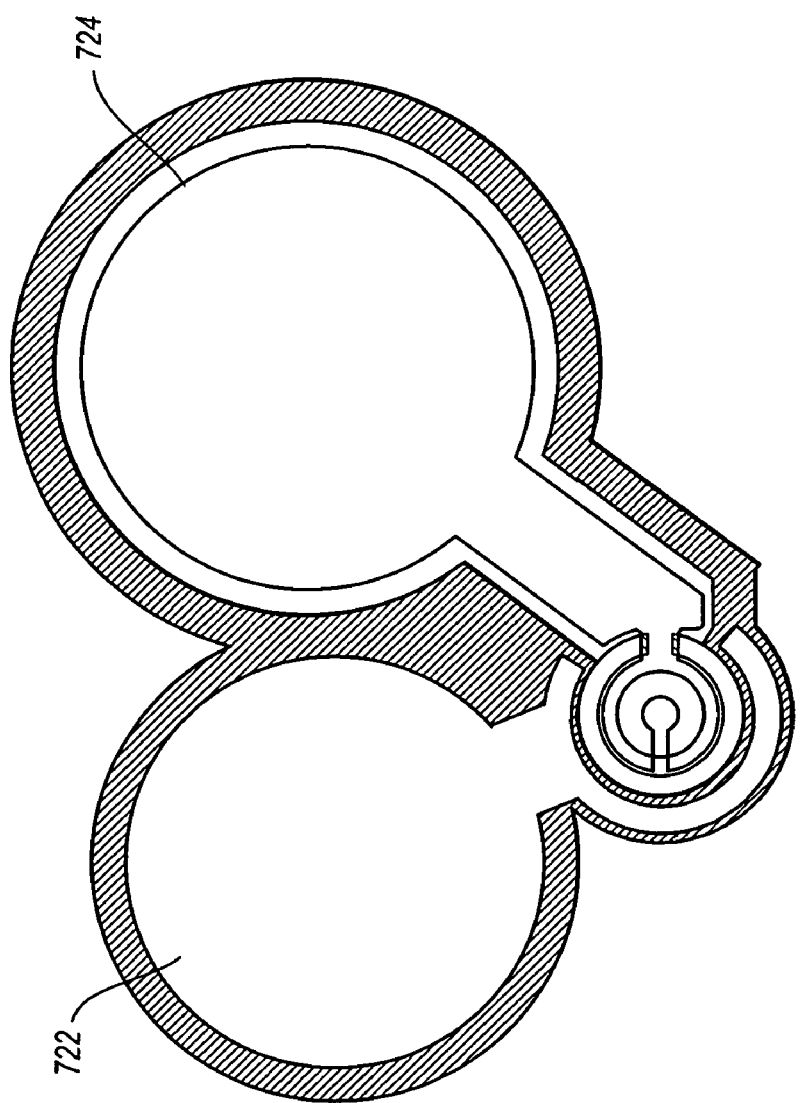
FIG. 7B is top view of an optoelectronic device structure and its contacts.

A top view of the optoelectronic device structure and contacts is shown in FIG. 7B. FIG. 7B illustrates the placement of the tunnel junction contact 722 and the VCSEL contact 724. While a single tunnel junction contact 722 is shown, in other embodiments, an additional tunnel junction contact may be formed opposite the tunnel junction contact 722 to provide for additional wire bonding options when packaging the optoelectronic device structure.

Figure 8:
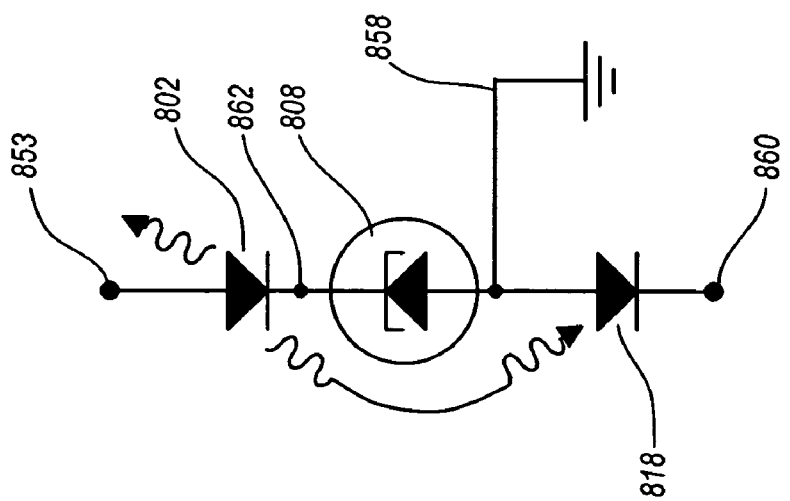
FIG. 8 is a schematic diagram illustrating the device of FIGS. 7A and 7B.

Referring now to FIG. 8, a schematic diagram illustrating the device of FIGS. 7A and 7B is shown. The schematic 800 of FIG. 8 illustrates a VCSEL diode 802 with a VCSEL contact 853 at the anode of the VCSEL diode 802. The cathode of the VCSEL diode 802 can be connected to the cathode of a super lattice tunnel junction 808. The super lattice tunnel junction 808 anode can be connected to the anode of a photodiode 818 at node 862. A tunnel junction contact 858 can be available at the anode of the super lattice tunnel junction 808 and the anode of the photodiode 818. A photodiode contact 860 is connected to the photodiode 856 cathode. The tunnel junction contact 858 may, in one application be connected to ground. A supply voltage may be connected to the VCSEL contact 853 and the photodiode contact 860. Alternatively, if different voltage levels are desirable for biasing the VCSEL diode 802 and the photodiode 818 one of the voltage levels can be derived from the supply voltage such as by using a boost converter or other voltage converter. In any case, using the particular embodiment illustrated, a single voltage supply source may be used to operate both the VCSEL diode 802 and the photodiode 818.

Figure 9:
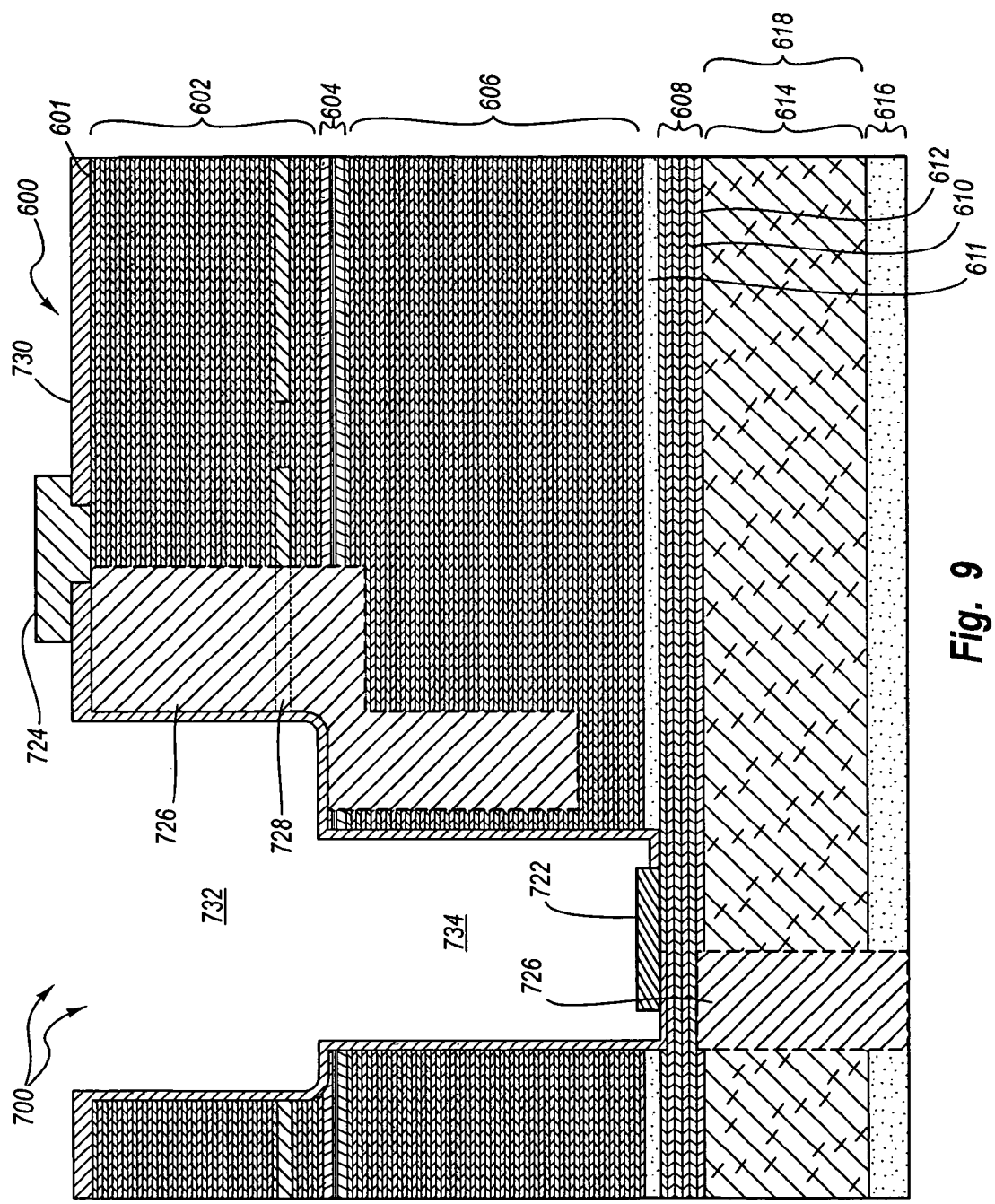
FIG. 9 illustrates an example where a super lattice tunnel junction contact is connected to a heavily doped n+ a layer as opposed to a connection to a heavily doped p+ layer as is shown in FIG. 7A.

Other example embodiments may also be implemented within the scope of embodiments of the present invention. For example, FIG. 9 illustrates an example where the tunnel junction contact 722 is connected to the heavily doped n+ layer 610 as opposed to the connection to the heavily doped p+ layer 612 as is shown in FIG. 7A. Schematically, this results in the tunnel junction contact 858 shown in FIG. 8 being located between the cathodes (at node 862) of the VCSEL diode 802 and the super lattice tunnel junction 808. This may be advantageous in some embodiments as it can reduce the amount of current that must pass through the super lattice tunnel junction 808.

In the embodiment shown in FIG. 8, the current from the VCSEL diode 602 can also pass through the super lattice tunnel junction 608. This current can be quite large compared to the current-through the photodiode 818. By placing the tunnel junction contact 722 between the cathodes of the VCSEL diode 601 and the super lattice tunnel junction 608 (node 852), only the current passing through the photodiode 618 need pass through the super lattice tunnel junction 608. This allows the super lattice tunnel junction 608 layers to be minimized so as to maximize their transparency. Various other changes may also be implemented such as reversing the order of the PN junction layers in each of the diodes.

Referring once again to FIG. 7A, an optimization of the optoelectronic device 700 that mitigates the effects of spontaneous emissions from the active region 604 will be discussed. The active region 604 can have emissions that may not necessarily be at the lasing wavelength, i.e., the wavelength at which the VCSEL 601 is intended to operate. It is desirable to detect just the lasing wavelength at the photodiode 618. To reduce the amount of spontaneous emissions that reach the photodiode 618, layers in the bottom mirror 606 with a high Ga fraction, i.e., the high index of refraction layers, may have the amount of Ga in them optimized such that they become heavily absorbing below the lasing wavelength.

While the above description has been framed in the context of VCSEL diodes, other light generating devices may also be used. For example, a resonant cavity light emitting diode (RCLED) may be used as a light generating device in place of the VCSEL diodes.

Some embodiments of the invention may find particular usefulness in self mixing laser applications. Self mixing laser applications make use of laser power reflected back into the laser cavity and more especially into the active region. This reflected laser power can change the output of the laser. The output of the laser may be changed such as by changing the wavelength of the laser or by causing the laser output to be modulated in various beat patterns. A change in the wavelength of the laser, however, may be almost undetectably small. Thus the change in the wavelength may be detected as a shift in phase of an optical signal. By continuously monitoring output from the laser, information can be gathered about conditions external to the laser. For example, using appropriate modulation and digital signal processing, information can be gathered about the distance of objects from a laser, movement of objects about the laser and the like. This allows the laser to be used in applications such as imaging, linear measurements, cursor pointers and the like.

The laser output may be modulated by increasing and decreasing the wavelength of the beam output by the laser, for example by changing the temperature of the laser. Thus, if the temperature of the laser can be controlled, the wavelength output from the laser can also be controlled. By modulating the laser wavelength, a chirp, e.g. rising and falling frequencies, can be used in a Doppler effect detector. An integrated photodiode is therefore useful for monitoring laser output power in self mixing applications where a Doppler effect causes a change in the output of the laser.

In some embodiments of the invention, a structure is fabricated to optimize or enhance the effects of reflections, temperature changes and the like. This can be accomplished by optimizing optical characteristics such as by allowing more light to be reflected from outside the laser into the active region. Other optimizations contemplate optimizing the laser to be effected by temperature changes such as by changing the thermal conductivity/resistance or thermal mass characteristics of the laser. Still other optimizations alter the threshold current versus temperature operating characteristics to change the characteristics of the laser by optimizing the linewidth enhancement factor.

Figure 10:
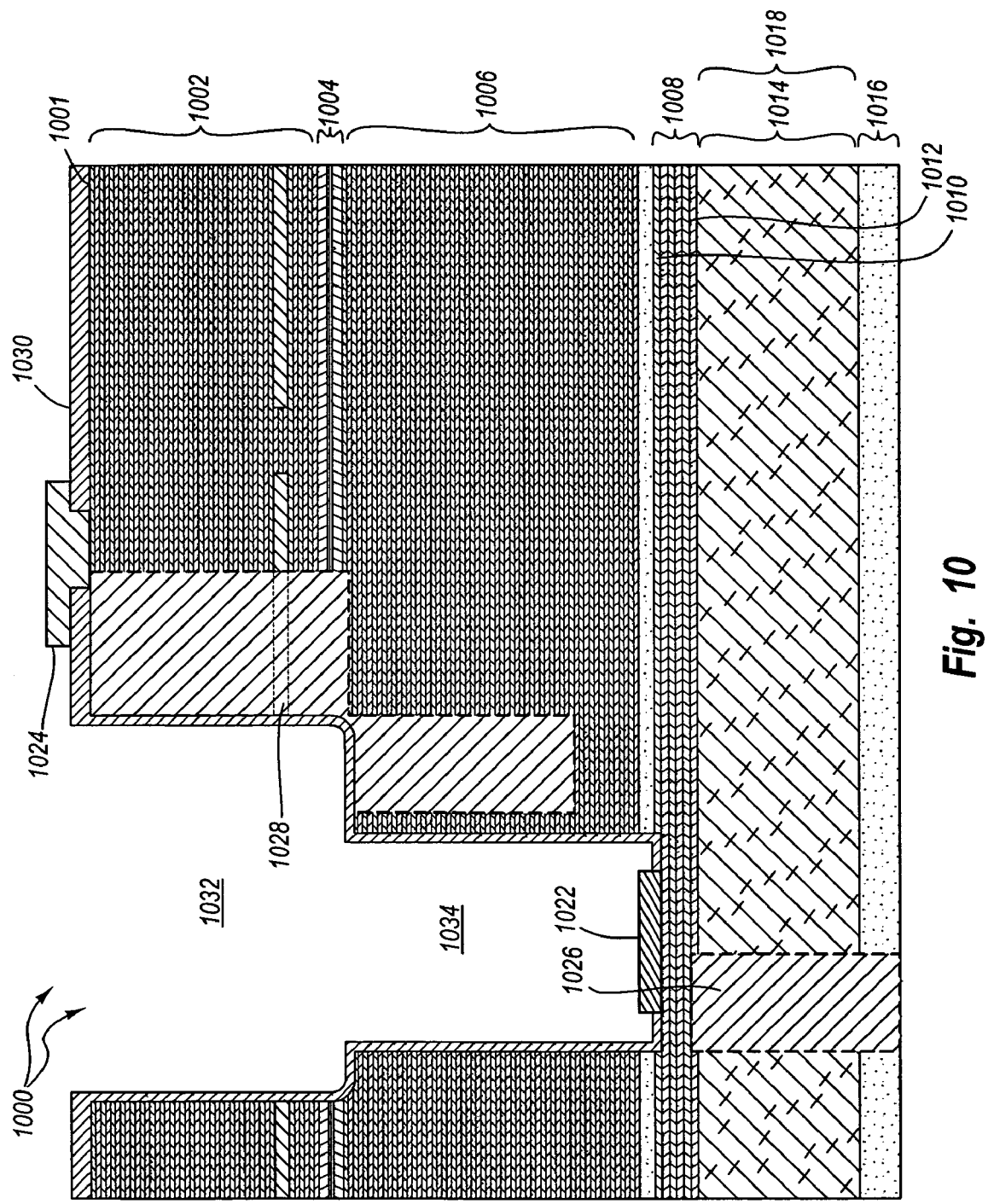

The following optimizations are particularly well suited for self mixing applications. It should therefore be understood that these optimizations are exemplary only, and not required by all embodiments of the invention. In fact, the optimizations used in self mixing applications are often the opposite of optimizations that may be used in other application. For example, while self mixing applications make use of temperature changes and reflections, other applications, such as communications applications, attempt to minimize these and other effects. These optimizations for use in self mixing applications will now be discussed with reference to FIG. 8. While characterized as optimizations, optimize as used herein does not require that the components be optimized to their absolute optimal configuration, but rather that the components be fabricated so as to increase sensitivity to reflections and thermal changes. FIG. 10 illustrates optimizations for self mixing applications to increase the sensitivity of an optoelectronic device to light reflections, temperature changes and the like. FIG. 10 illustrates an optoelectronic device 1000 that includes a VCSEL 1001 with integrated photodiode 1018.

Optical Characteristic Optimization

One method of increasing the sensitivity of the VCSEL 1001 is by fabricating the optoelectronic device 1000 to allow more light to be reflected into the active region 1004. This may be done by changing the doping levels of the alternating layers in the top mirror 1002 to be more lightly doped. This causes the top mirror 1002 to be more translucent to light reflected back into the active region 1004.

By reducing the doping in the alternating layers of the top mirror 1002, electrical resistance is increased. This causes the VCSEL 1001 to run at a higher temperature. Thus by reducing the doping in the top mirror 1002, sensitivity of the VCSEL 1001 is compounded by the combined effects of a more translucent top mirror 1002 and increased temperature sensitivity of the VCSEL 1001. Temperature sensitivities will be covered in more detail below.

The opaqueness of the VCSEL 1001 may also be optimized by appropriately selecting the thickness of a dielectric layer 1030 on the top mirror 1002. Ordinarily, it is desirable to make the top mirror 1002 as reflective as possible. However, in self mixing applications it may be desirable to make the top mirror 1002 less reflective and more translucent. To make the top mirror 1002 more reflective the dielectric layer 1030 is placed on the top mirror 1002 where the dielectric layer 1030 has a thickness that is nearly some integral multiple of a half wavelength of the wavelength for which the laser 1001 is designed. To make the top mirror 1002 more translucent, the dielectric layer 1030 can be designed such that is a multiple of an odd quarter wavelength. For example, the thickness of the dielectric layer 1030 may be selected such that the thickness is $$\frac{2n+1}{4}\lambda$$

where n is an integer and $\lambda$ is the wavelength of design for the laser 1001. Optimizing the dielectric layer 1030 allows for other thicknesses to be used depending on the desired opaqueness of the top mirror 1002.

Thermal Characteristic Optimization

Another way of increasing the sensitivity of the VCSEL 1001 is by changing the thermal characteristics of the epitaxial layers. More particularly, it may be desirable to increase the sensitivity of the optoelectronic device 1000 to temperature variations so as to be able to control modulation of the output wavelength of the VCSEL 1001. Optimizations of thermal characteristics may fall into different categories, such as for example, optimizations to thermal impedance and optimizations to thermal mass.

Thermal impedance is a measure of a devices ability to conduct heat. The less able a device is to conduct heat, the quicker the temperature will rise in the device as heat is applied. For example, if a device is less conductive of thermal energy, a given level of current will cause the operating temperature of the device to rise more quickly. This causes a corresponding change in the wavelength at which the device, such as a VCSEL 1001, operates.

Thermal mass is a measure of a components temperature rise for a given amount of heat. A greater thermal mass means that the temperature does not increase as rapidly for a given amount of heat and the temperature change occurs more slowly. One way of increasing thermal mass is by increasing the physical mass of the device or by increasing connections to devices capable of dissipating heat. For example, connecting a heatsink, such as a large piece of metal with a large amount of surface area increases the thermal mass. In some embodiments of the invention, such as self mixing applications, it is desirable to reduce the thermal mass to optimize wavelength changes based on current changes in the VCSEL 1001.

To make the optoelectronic device 1000 more sensitive to temperature variations by decreasing thermal mass, contacts such as contacts 1024 and 1022 may be optimized by minimizing their physical size to reduce their heatsinking effect. In one embodiment, the contacts are designed to be a minimal size sufficient for carrying an amount of current needed to appropriately bias and power the various diodes in the optoelectronic device 1000.

One way of increasing thermal sensitivity in the optoelectronic device 1000 by decreasing thermal conductivity is by forming a trench around the active region. This prevents some amount of thermal conduction from heat generating parts of the optoelectronic device 1000 to other materials that may provide heatsinking functionality. In one embodiment, forming a trench may be accomplished by optimizing the shallow trench 1032 to extend below the active region 1004. In the example shown in FIG. 10, by extending the shallow trench 1032 below the active region 1004, the VCSEL 1001 becomes more sensitive to temperature variations.

Another method of optimizing the thermal conductivity of the optoelectronic device including the optoelectronic device 1000 is by selecting an appropriate construction of the bottom mirror 1006. The mirrors 1002 and 1006 may be formed of layers alternating low and high index of refraction layers. Notable, binary type materials, i.e., those formed from two elements, are more thermally conductive than ternary type materials, i.e., those formed from three elements. In FIG. 10, the high index of refraction layers and low index layers in the bottom mirror 1006 are AlGaAs where the Al fraction may be selected from the range from 0% to 100%. The lower refractive index layers have a higher Al fraction. By forming a number of ternary layers, such as AlGaAs near the active region and keeping binary layers such as AlAs and GaAs layers, if present, further from the active region, the thermal conductivity can be decreased.

Yet another method of optimizing the thermal conductivity for self mixing applications of the optoelectronic device involves increasing the number of mirror periods in the mirrors 1002 and 1006. This causes a decrease in the thermal conductivity of the VCSEL 1001. To maintain an appropriate reflectivity of the mirrors 1002 and 1006, it may be useful to vary the Al/Ga ratio in the individual mirror periods to maintain a total desired reflectivity for all of the mirror periods when combined to form the mirrors 1002 and 1006.

There is some need to balance thermal conductivity and thermal mass so as to preserve the ability to change temperature, and thus wavelength, quickly. Namely, if thermal mass is decreased, the thermal impedance can be increased and if the thermal impedance is increased, the thermal mass can be decreased.

Increasing the electrical impedance of a device generally causes more heat to be generated in the device for a given current. For a constant thermal mass and thermal conductivity, increases in heat generated increases operating temperature. As mentioned above, one way of increasing the electrical impedance is by reducing the doping in the top mirror 1002. A similar reduction in the doping in the bottom mirror 1006 will have a similar effect.

Another method of optimizing the electrical impedance of the optoelectronic device 1000 is by controlling the size of the aperture 1028. By oxidizing the aperture 1028 further into the VCSEL 1001 structure, the opening of the aperture 1028 is decreased thereby decreasing the area available for current flow through the VCSEL 1001. This in turn increases the electrical impedance of the VCSEL 1001. By controlling the electrical impedance of the VCSEL 1001, current controls can be used to regulate the heat generated by the VCSEL 1001 and therefore the operating temperature of the VCSEL 1001.

Linewidth Enhancement Factor Optimization

Figure 11:
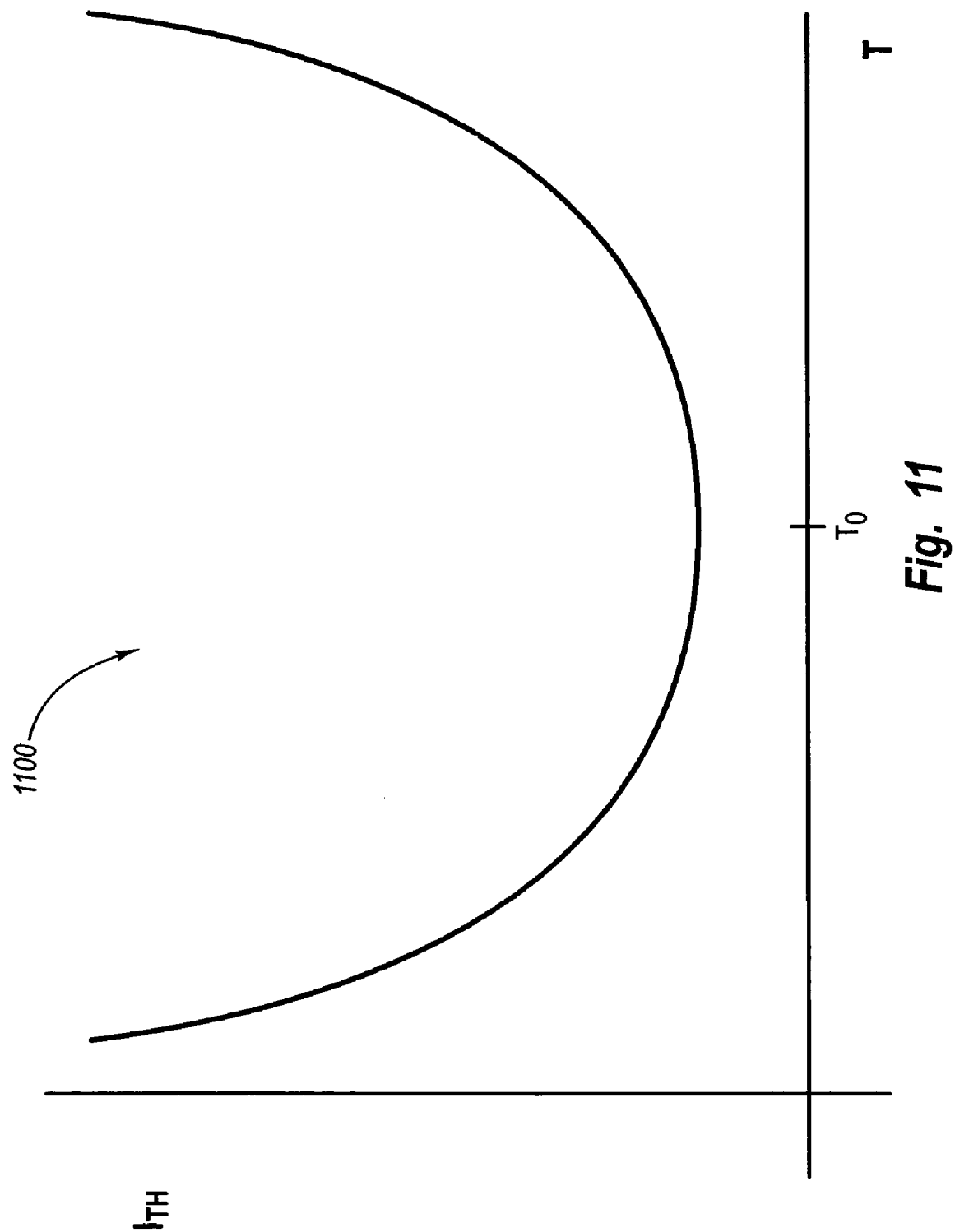
FIG. 11 depicts a curve that illustrates the relationship between the threshold current and the operating temperature of a VCSEL.

One optimization alters the characteristics of a laser so as to change the threshold current versus temperature operating characteristics, which affects the linewidth enhancement factor. Referring now FIG. 11, a curve 1100 is shown that illustrates the relationship between the threshold current and the operating temperature of a VCSEL. Shown on the curve 1100 is a point $T_0$ where the threshold voltage for the VCSEL is at its lowest value with respect to the temperature. By adjusting $T_0$ to higher values relative to the expected operating temperature, a VCSEL can be optimized for sensitivity in self mixing applications. The linewidth enhancement factor is increased as $T_0$ is moved above the operating temperature.

VCSEL With Super Lattice Tunnel Junction

Figure 12:
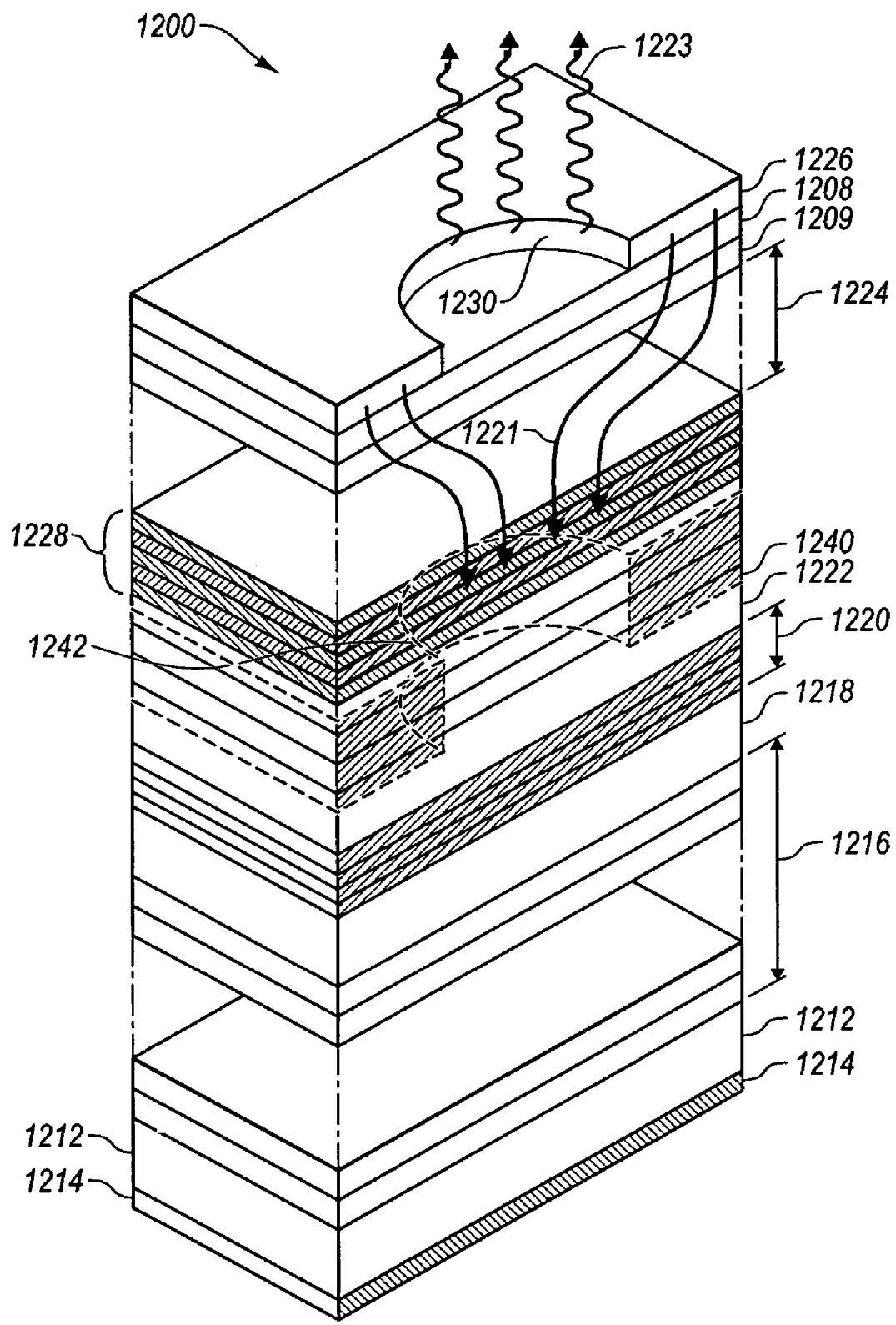
FIG. 12 illustrates a VCSEL having a super lattice tunnel junction according to an example embodiment of the present invention.

As discussed above, a super lattice tunnel junction can be included with other devices according to example embodiments of the present invention. Referring to FIG. 12, a VCSEL 1200 having a super lattice tunnel junction 1228 is illustrated according to an example embodiment of the present invention. An n-doped GaAs or indium phosphorus (InP) substrate 1212 has an n-type electrical contact 1214. An n-doped lower mirror stack 1216 (e.g. a DBR) can be on the substrate 1212, and an n-type graded-index InP lower spacer 1218 can be disposed over the lower mirror stack 1216. An active region 1220, usually having a number of quantum wells, is formed over the lower spacer 1218. Over the active region 1220 is a super lattice tunnel junction 1228. Over the super lattice tunnel junction 1228 can be an n-type graded-index top spacer 1222 and an n-type top mirror stack 1224 (e.g. another DBR), which can be disposed over the top spacer 1222. Over the top mirror stack 1224 can be an n-type conduction layer 1209, an n-type cap layer 1208, and an n-type electrical contact 1226.

The lower spacer 1218 and the top spacer 1222 separate the lower mirror stack 1216 from the top mirror stack 1224 such that an optical cavity is formed. As the optical cavity is resonant at specific wavelengths, the mirror separation is controlled to resonate at a predetermined wavelength (or at a multiple thereof). At least part of the top mirror stack 1224 can include an insulating region 1240 that provides current confinement. The insulating region 1240 can be formed either by implanting protons into the top mirror stack 1224 or by forming an oxide layer. The insulating region 1240 can define a conductive annular central opening 1242 that forms an electrically conductive path though the insulating region 1240. When such a current confinement structure is adopted for a VCSEL, the super lattice tunnel junction 1228 can also be placed above the current confinement structure (here, the insulating region 1240).

In operation, an external bias causes an electrical current 1221 to flow from the electrical contact 1226 toward the electrical contact 1214. The insulating region 1240 and the conductive central opening 1242 confine the current 1221 such that the current flows through the conductive central opening 1242 and into the super lattice tunnel junction 1228. The super lattice tunnel junction 1228 converts incoming electrons into holes that are injected into the active region 1220. Some of the injected holes are converted into photons in the active region 1220. Those photons bounce back and forth (i.e. resonate) between the lower mirror stack 1216 and the top mirror stack 1224. While the lower mirror stack 1216 and the top mirror stack 1224 are very good reflectors, some of the photons leak out as light 1223 that travels along an optical path. The light 1223 passes through the conduction layer 1209, the cap layer 1208, an aperture 1230 in electrical contact 1226, and out of the surface of the vertical cavity surface emitting laser 1210.

It should be understood that FIG. 12 illustrates an embodiment of a device, in this instance a VCSEL, comprising a super lattice tunnel junction, and that numerous different components and variations are possible. For example, according to other examples of VCSELs with super lattice tunnel junctions the dopings can be changed (e.g. by providing a p-type substrate), different material systems can be used, operational details can be tuned for maximum performance, and additional structures and features can be added.

This can enables a low voltage drop across the super lattice tunnel junctions, and low free carrier absorption and sufficient free carriers in the semiconductor lasers. Dopants for such tunnel junctions can provide a high doping level in semiconductor matrix and should not diffuse around so as to maintain a sharp doping profile. Thus, a super lattice tunnel junction can be created with overall parameters that allow construction of robust tunnel junctions without having to dope both sides as heavily as in the prior art.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes that come within the meaning and range of equivalency of the claims are to be embraced within their scope.

What is claimed is:

1. A tunnel junction for providing a common connection to two components, the tunnel junction comprising:
   a first semiconductor material having a resistance parameter for conducting a current and a critical thickness at which lattice matching of the first semiconductor material causes dislocation; and
   a second semiconductor material having a resistance parameter that is more restrictive to conduction of a current than the resistance parameter of the first semiconductor material and a critical thickness at which lattice matching of the second semiconductor material causes dislocation, wherein the critical thickness of the second semiconductor is thicker than the critical thickness of the first semiconductor material.

2. A tunnel junction according to claim 1, wherein the overall resistance parameter of the super lattice tunnel junction is less restrictive to conduction of a current than the resistance parameter of the second semiconductor material at the same thickness, and wherein the overall critical thickness of the super lattice tunnel junction is greater than the critical thickness of the first semiconductor material.

3. A tunnel junction according to claim 1, wherein the first semiconductor material comprises indium.

4. A tunnel junction according to claim 1, wherein the first semiconductor material comprises indium gallium arsenide and the second semiconductor material comprises gallium arsenide.

5. A tunnel junction according to claim 4, wherein the second semiconductor material also comprises indium of a lower relative proportion as compared to the amount of indium in the second semiconductor material.

6. An optoelectronic device comprising a tunnel junction according to claim 1.

7. An optoelectronic device according to claim 6, wherein the optoelectronic device is a vertical cavity surface emitting laser comprising the super lattice tunnel junction.

8. An optoelectronic device according to claim 6, wherein the optoelectronic device further comprises:
   a vertical cavity surface emitting laser (VCSEL);
   a photodiode, wherein the VCSEL and photodiode both receive a current from the tunnel junction.

9. An optoelectronic device comprising:
   a vertical cavity surface emitting laser (VCSEL) diode comprising a first PN junction with a first p layer and a first n layer;
   a tunnel junction coupled monolithically to the VCSEL diode, the tunnel junction comprising:
   a heavily doped n+ layer and a heavily doped p+ layer;
   a first material layer comprising a first III-V semiconductor material layer having a first resistance parameter and a first critical thickness parameter;
   a second material layer comprising a second III-V semiconductor material layer having a second resistance parameter that is less resistive than the first resistance parameter and a second critical thickness parameter that is thinner than the first critical thickness parameter; and
   a photodiode coupled monolithically to the tunnel junction.

10. An optoelectronic device according to claim 9, wherein the second material layer comprises indium.

11. An optoelectronic device according to claim 9, wherein the first material layer comprises gallium arsenide and the second material layer comprises indium gallium arsenide.

12. An optoelectronic device according to claim 11, wherein the first material layer comprises indium, but less indium in proportion to the second material layer.

13. An optoelectronic device according to claim 9, wherein the tunnel junction further comprises several alternating layers of the first material and the second material, and wherein the thickness of the tunnel junction is at least 150 nanometers.

14. The optoelectronic device of claim 9, wherein the second PN junction comprises one of the heavily doped n+ layer and the heavily doped p+ layer.

15. The optoelectronic device of claim 9, wherein the first n layer is attached at the n+ layer and the first p layer is attached at the p+ layer.

16. The optoelectronic device of claim 9, further comprising a tunnel junction contact coupled to the n+ layer and a tunnel junction contact coupled to the p+ layer.

17. The optoelectronic device of claim 9, wherein the first PN junction comprises:
   a p type DBR mirror;
   a VCSEL active region coupled to the p type DBR mirror;
   an n type DBR mirror coupled to the VCSEL active region; and
   wherein the p type DBR mirror comprises layers with doping optimized for a more translucent mirror.

18. The optoelectronic device of claim 9, further comprising:
   a first contact coupled to the VCSEL;
   a second contact coupled to the tunnel junction;
   a third contact coupled to the photodiode; and
   wherein the contacts are optimized to reduce the thermal mass of the optoelectronic device.

19. The optoelectronic device of claim 9, wherein the VCSEL comprises an active region, the optoelectronic device further comprising a trench about the active region, the trench optimized to reduce the thermal conductivity of the optoelectronic device.

20. The optoelectronic device of claim 19, wherein the trench comprises an optimized radius.

21. The optoelectronic device of claim 9, further comprising a dielectric layer disposed on the VCSEL, the dielectric layer being optimized to allow the VCSEL to be more translucent.

22. The optoelectronic device of claim 21, wherein the dielectric layer has a thickness of about $((2n+1)/4)*\lambda$ for n equal to an integer and $\lambda$ equal to the wavelength of design for the VCSEL.

23. The optoelectronic device of claim 9, wherein the first PN junction comprises:
- a p type DBR mirror;
- a VCSEL active region coupled to the p type DBR mirror;
- an n type DBR mirror coupled to the VCSEL active region; and
- wherein the n type DBR mirror comprises layers of alternating high and low refractive index layers, wherein a plurality of the low refractive index layers near the active region comprise AlGaAs and a plurality of the low refractive index layers further from the active region comprise AlAs and GaAs to optimize the thermal conductivity of the optoelectronic device for use in self mixing applications.

24. The optoelectronic device of claim 9, the VCSEL further comprising a $T_0$ optimized for self-mixing applications.

25. The optoelectronic device of claim 9, the VCSEL further comprising a bottom mirror, the bottom mirror comprising alternating high and low index of refraction layers wherein at least a portion of the alternating layers of the bottom mirror comprise an optimized Ga fraction for reducing spontaneous emissions from reaching the photodiode.

* * * * *